US011626876B2

(12) United States Patent
Wijetunga et al.

(10) Patent No.: US 11,626,876 B2
(45) Date of Patent: Apr. 11, 2023

(54) SELF-ISOLATING OUTPUT DRIVER

(71) Applicant: Rambus Inc., San Jose, CA (US)

(72) Inventors: Panduka Wijetunga, Thousand Oaks, CA (US); Dhiraj Kumar, Bangalore (IN)

(73) Assignee: Rambus Inc., San Jose, CA (US)

(*) Notice: Subject to any disclaimer, the term of this patent is extended or adjusted under 35 U.S.C. 154(b) by 0 days.

(21) Appl. No.: 17/393,844

(22) Filed: Aug. 4, 2021

(65) Prior Publication Data
US 2022/0052690 A1 Feb. 17, 2022

Related U.S. Application Data

(60) Provisional application No. 63/115,186, filed on Nov. 18, 2020, provisional application No. 63/066,017, filed on Aug. 14, 2020.

(51) Int. Cl.
*H03K 19/007* (2006.01)
*H03K 19/003* (2006.01)

(52) U.S. Cl.
CPC ..... *H03K 19/007* (2013.01); *H03K 19/00361* (2013.01); *H03K 19/00384* (2013.01)

(58) Field of Classification Search
None
See application file for complete search history.

(56) References Cited

U.S. PATENT DOCUMENTS

| | | | | |
|---|---|---|---|---|
| 5,543,733 A | * | 8/1996 | Mattos | H03K 19/00315 326/68 |
| 5,933,025 A | * | 8/1999 | Nance | H03K 19/018521 326/83 |
| 5,973,530 A | * | 10/1999 | Morris | H03K 3/356165 327/333 |
| 6,208,178 B1 | * | 3/2001 | Chen | H03K 19/00315 327/108 |

OTHER PUBLICATIONS

Hronik, Stanley, "Designing for Hot Insertion and Multiple Power Supply Systems", Renesas Application Note AN-158, 2019 Renesas Electronics Corporation, Downloaded at: https://www.idt.com/us/en/document/apn/158-designing-hot-insertion, 6 pages.

* cited by examiner

*Primary Examiner* — Jany Richardson
(74) *Attorney, Agent, or Firm* — The Neudeck Law Firm, LLC

(57) ABSTRACT

Push-pull integrated circuit output drivers may interfere with communication by other entities on a bus when an integrated circuit is powered down. When there is no power and/or when the bonding pad is externally driven above the internal supply voltage, the substrate/body/well of the p-channel field effect transistor (PFET) of the output driver is biased to prevent its drain diode from becoming forward biased thereby preventing interference with communication on the bus. Also, when there is no power, driver is powered down or pull up is disabled, the gate of the driver PFET is driven to a voltage that ensures the driver PFET remains off when the bonding pad is externally driven above the internal supply voltage.

20 Claims, 8 Drawing Sheets

```
┌─────────────────────────────────────────────────────────────┐
│  RECEIVE, BY AN INTEGRATED CIRCUIT, A FIRST VOLTAGE LEVEL FROM │
│              AN OUTPUT DRIVER POWER SUPPLY                  │
│                           602                                │
└─────────────────────────────────────────────────────────────┘
                              │
┌─────────────────────────────────────────────────────────────┐
│  PROVIDE THE FIRST VOLTAGE LEVEL TO A SOURCE TERMINAL OF A P- │
│   CHANNEL FIELD EFFECT TRANSISTOR (PFET), THE PFET HAVING A │
│  DRAIN TERMINAL DC CONNECTED TO A FIRST EXTERNAL TERMINAL OF │
│    THE INTEGRATED CIRCUIT, THE EXTERNAL TERMINAL OF THE     │
│  INTEGRATED CIRCUIT HAVING A FIRST VARIABLE PAD VOLTAGE LEVEL │
│   THAT DOES NOT EXCEED THE FIRST VOLTAGE LEVEL WHILE THE    │
│         INTEGRATED CIRCUIT IS IN AN OPERATIONAL MODE        │
│                           604                                │
└─────────────────────────────────────────────────────────────┘
                              │
┌─────────────────────────────────────────────────────────────┐
│   RECEIVE, BY THE INTEGRATED CIRCUIT AND WHILE THE INTEGRATED │
│   CIRCUIT IS IN A NON-OPERATIONAL MODE, A SECOND VOLTAGE LEVEL │
│    FROM THE OUTPUT DRIVER POWER SUPPLY, THE SECOND VOLTAGE  │
│          LEVEL BEING LESS THAN THE FIRST VOLTAGE LEVEL      │
│                           606                                │
└─────────────────────────────────────────────────────────────┘
                              │
┌─────────────────────────────────────────────────────────────┐
│   RECEIVE, BY THE INTEGRATED CIRCUIT AND WHILE THE INTEGRATED │
│    CIRCUIT IS IN THE NON-OPERATIONAL MODE, A SECOND VARIABLE │
│    PAD VOLTAGE LEVEL THAT IS GREATER THAN THE SECOND VOLTAGE │
│                            LEVEL                             │
│                           608                                │
└─────────────────────────────────────────────────────────────┘
                              │
┌─────────────────────────────────────────────────────────────┐
│  IN RESPONSE TO THE SECOND VARIABLE PAD VOLTAGE LEVEL BEING │
│  GREATER THAN THE SECOND VOLTAGE LEVEL, PROVIDE THE SECOND  │
│   VARIABLE PAD VOLTAGE LEVEL TO THE BODY TERMINAL OF THE PFET │
│                           610                                │
└─────────────────────────────────────────────────────────────┘
```

*FIG. 6*

SELF-ISOLATING OUTPUT DRIVER

BRIEF DESCRIPTION OF THE DRAWINGS

FIG. 6 is a flowchart illustrating a method of operating an integrated circuit.

DETAILED DESCRIPTION OF THE EMBODIMENTS

Push-pull output drivers may interfere with communication by other entities on a bus when an integrated circuit is powered down. In an embodiment, when there is no power and/or when the bonding pad is externally driven above the internal supply voltage, the substrate/body/well of the p-channel field effect transistor (PFET) of the output driver is biased to prevent its drain diode from becoming forward biased thereby preventing interference with communication on the bus. Also, when there is no power, driver is powered down or pull up is disabled, the gate of the driver PFET is driven to a voltage that ensures the driver PFET remains off and the driver PFET body diode remains reverse biased when the bonding pad is externally driven above the internal supply voltage.

In an embodiment, switching circuitry detects when the internal driver supply voltage falls below the voltage on the bonding pad. When the internal supply voltage falls below the voltage on the bonding pad, the switching circuitry applies the voltage on the bonding pad to the driver PFET's body terminal thereby ensuring the drain to body diode of the PFET does not become forward biased. The switching circuitry also applies the voltage on the bonding pad to the logic driving the gate of the driver PFET which ensures that the PFET remains off.

Figure 1:
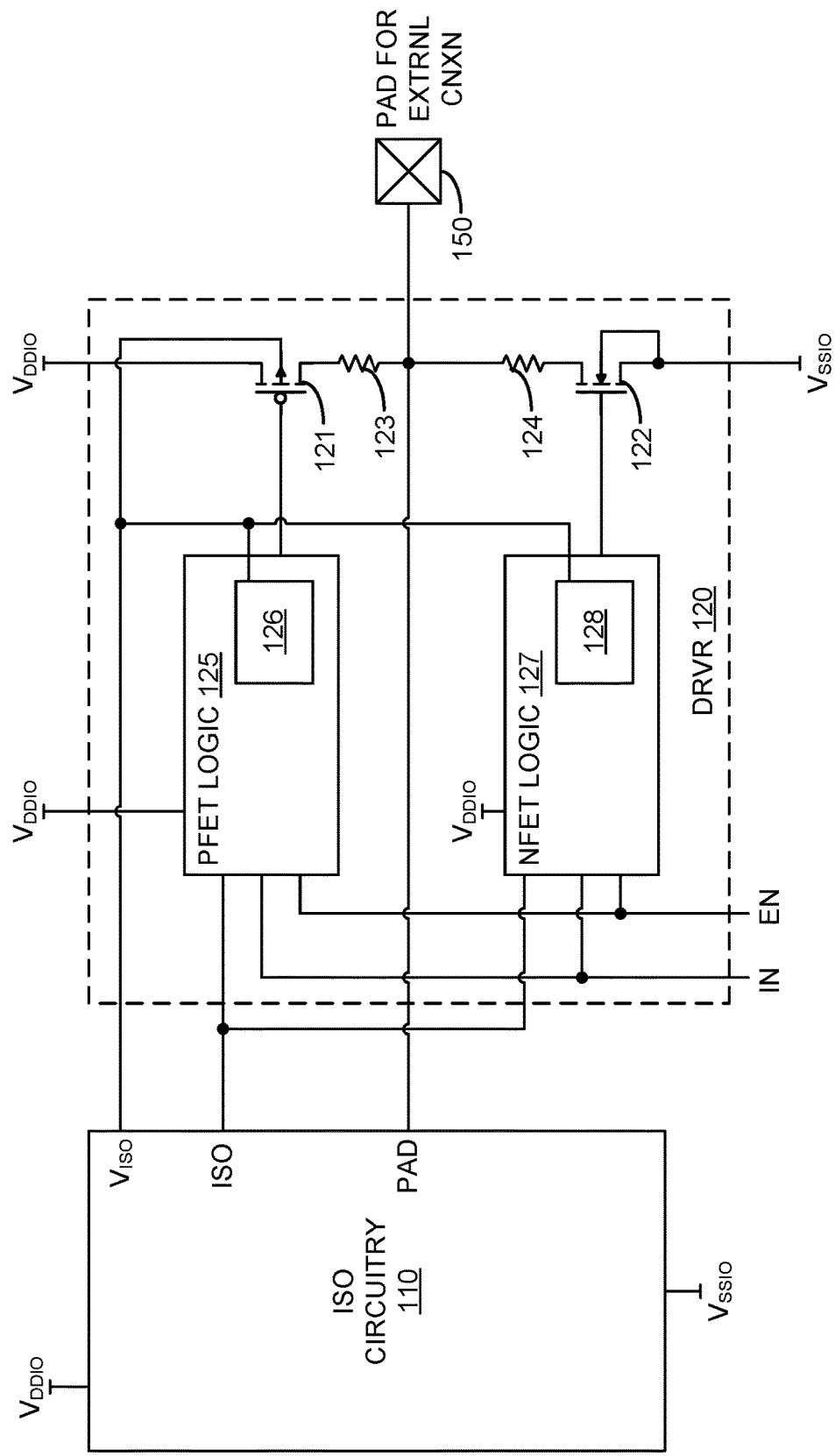
FIG. 1 is a diagram illustrating a first example of a self-isolating driver.

FIG. 1 is a diagram illustrating a first example of a self-isolating driver. In FIG. 1, integrated circuit output driver 100 includes isolation circuitry 110, driver circuitry 120, and bonding pad 150. Driver circuitry 120 includes driver PFET 121, driver NFET 122, optional resistor 123, optional resistor 124, PFET logic 125, and n-channel field effect transistor (NFET) logic 127. PFET logic 125 includes isolation logic 126. NFET logic 127 includes isolation logic 128.

Isolation circuitry 110 and driver circuitry 120 receive positive driver supply voltage $V_{DDIO}$ and negative driver supply voltage $V_{SSIO}$. Isolation circuitry 110 provides isolation signal (ISO) to PFET logic 125 and NFET logic 127. Isolation circuitry 110 provides isolation voltage $V_{ISO}$ to the body/n-well of driver PFET 121, isolation logic 126 of PFET logic 125, and isolation logic 128 of NFET logic 127. Isolation circuitry 110 is connected to bonding pad 150 to receive the voltage on bonding pad 150.

PFET logic 125 and NFET logic 127 receive VDDIO. PFET logic 125 and NFET logic 127 receive control signals that include an input signal (IN) and an enable signal (EN). PFET logic 125 and NFET logic 127 may receive additional signals not shown in FIG. 1. The source of driver PFET 121 receives VDDIO. The gate of PFET 121 is connected to PFET logic 125 and isolation logic 126, in particular. The drain of driver PFET 121 is connected to a first terminal of resistor 123. A second terminal of resistor 123 is connected to bonding pad 150. A first terminal of resistor 124 is connected to bonding pad 150. A second terminal of resistor 124 is connected to the drain of driver NFET 122. The gate of driver NFET 122 is connected to NFET logic 127 and isolation logic 128, in particular. The source and body of driver NFET 122 are connected to the negative driver supply voltage $V_{SSIO}$.

In an embodiment, isolation circuitry 110 monitors whether the voltage on bonding pad 150 exceeds the positive driver supply voltage $V_{DDIO}$. If the voltage on bonding pad 150 is less than the positive driver supply voltage $V_{DDIO}$ (e.g., in normal operation), isolation circuitry 110 provides $V_{DDIO}$ as the isolation voltage $V_{ISO}$ to the body/n-well of driver PFET 121, isolation logic 126 of PFET logic 125, and isolation logic 128 of NFET logic 127. When the voltage on bonding pad 150 is less than the positive driver supply voltage VDDIO, isolation circuitry 110 provides an inactive assertion of isolation signal ISO to isolation logic 126 of PFET logic 125, and isolation logic 128 of NFET logic 127.

If the voltage on bonding pad 150 is greater than the positive driver supply voltage $V_{DDIO}$ (e.g., when VDDIO is turned off and/or pad 150 is pull above the $V_{DDIO}$ voltage), isolation circuitry 110 provides the voltage on bonding pad 150 as the isolation voltage $V_{ISO}$ to the body/n-well of driver PFET 121, isolation logic 126 of PFET logic 125, and isolation logic 128 of NFET logic 127.

Providing the voltage on bonding pad 150 the body/n-well of driver PFET 121 keeps the body/n-well and the drain of driver PFET 121 at the same voltage level. This prevents the drain diode of driver PFET 121 from becoming forward biased and as a result drawing current via bonding pad 150 (and the bus connected to bonding pad 150.)

When the voltage on bonding pad 150 is greater than the positive driver supply voltage $V_{DDIO}$, isolation circuitry 110 provides an active assertion of isolation signal ISO to isolation logic 126 of PFET logic 125, and isolation logic 128 of NFET logic 127. When isolation logic 126 receives the active ISO signal, isolation logic 126 drives the gate of driver PFET to $V_{ISO}$ thereby ensuring that driver PFET 121 remains in a non-conducting (off) state. When isolation logic 128 receives the active ISO signal, isolation logic 128 drives the gate of driver NFET to $V_{SSIO}$ thereby ensuring that driver NFET 122 remains in a non-conducting (off) state. In an embodiment, when the voltage on bonding pad 150 is greater than the positive driver supply voltage $V_{DDIO}$, isolation logic 126 and isolation logic 128 may be powered by the $V_{ISO}$ received from isolation circuitry 110.

Figure 2:
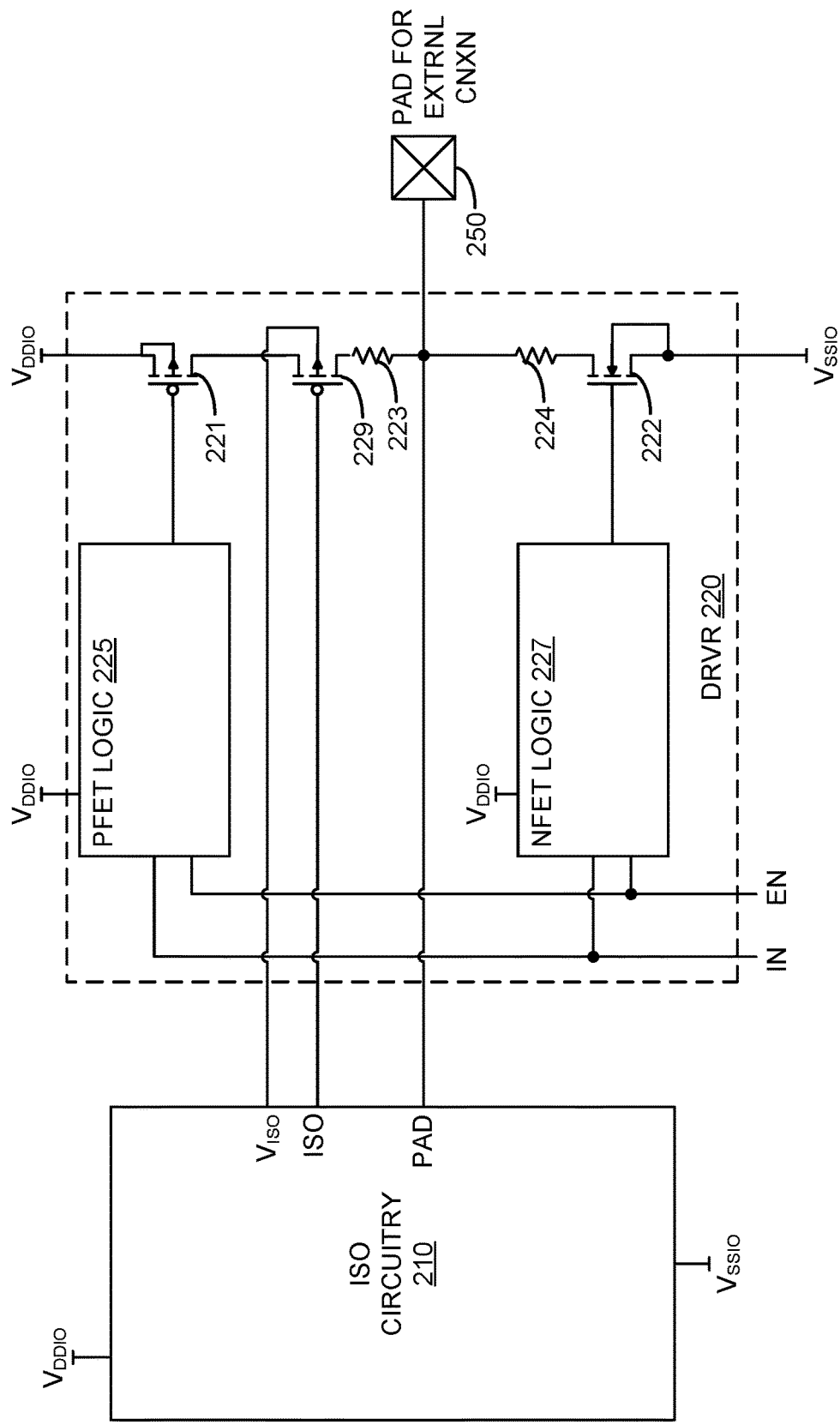
FIG. 2 is a diagram illustrating a second example of a self-isolating driver.

FIG. 2 is a diagram illustrating a second example of a self-isolating driver. In FIG. 2, integrated circuit output driver 200 includes isolation circuitry 210, driver circuitry 220, and bonding pad 250. Driver circuitry 220 includes driver PFET 221, driver NFET 222, resistor 223, resistor 224, PFET logic 225, n-channel field effect transistor (NFET) logic 227, and isolation PFET 229.

Isolation circuitry 210 and driver circuitry 220 receive positive driver supply voltage $V_{DDIO}$ and negative driver supply voltage $V_{SSIO}$. Isolation circuitry 210 provides isolation signal (ISO) to the gate of isolation PFET 229. Isolation circuitry 210 provides isolation voltage $V_{ISO}$ to the body/n-well of isolation PFET 229. Isolation circuitry 210 is connected to bonding pad 250 to receive the voltage on bonding pad 250.

PFET logic 225 and NFET logic 227 receive VDDIO. PFET logic 225 and NFET logic 227 receive an input signal (IN) and an enable signal (EN). The source of driver PFET 221 receives $V_{DDIO}$. The gate of PFET 221 is connected to PFET logic 225. The drain of driver PFET 221 is connected to the source of isolation PFET 229. The gate of isolation PFET 229 is connected to isolation signal ISO. The drain of isolation PFET 229 is connected to a first terminal of resistor 223. A second terminal of resistor 223 is connected to bonding pad 250. A first terminal of resistor 224 is connected to bonding pad 250. A second terminal of resistor 224 is connected to the drain of driver NFET 222. The gate of driver NFET 222 is connected to NFET logic 227. The source and body of driver NFET 228 are connected to the negative driver supply voltage $V_{SSIO}$.

In an embodiment, isolation circuitry 210 monitors whether the voltage on bonding pad 250 exceeds the positive driver supply voltage $V_{DDIO}$. If the voltage on bonding pad 250 is less than the positive driver supply voltage $V_{DDIO}$ (e.g., in normal operation), isolation circuitry 210 provides $V_{DDIO}$ as the isolation voltage $V_{ISO}$ to the body/n-well of isolation PFET 229. When the voltage on bonding pad 250 is less than the positive driver supply voltage $V_{DDIO}$, isolation circuitry 210 provides an inactive assertion (e.g. $V_{SSIO}$) of isolation signal ISO to isolation PFET 229 thereby keeping isolation PFET 229 in a conducting state.

If the voltage on bonding pad 250 is greater than the positive driver supply voltage $V_{DDIO}$ (e.g., when $V_{DDIO}$ is turned off and/or pad 250 is pulled above $V_{DDIO}$ voltage), isolation circuitry 210 provides the voltage on bonding pad 250 as the isolation voltage $V_{ISO}$ to the body/n-well of isolation PFET 229. Providing the voltage on bonding pad 250 the body/n-well of isolation PFET 229 keeps the body/n-well and the drain of isolation PFET 229 at the same voltage level. This prevents the drain diode of isolation PFET 229 from becoming forward biased and as a result drawing current via bonding pad 250 (and the bus connected to bonding pad 250.)

When the voltage on bonding pad 250 is greater than the positive driver supply voltage $V_{DDIO}$, isolation circuitry 210 provides an active assertion (e.g., $V_{ISO}$) of isolation signal ISO to the gate of isolation PFET 229. Applying $V_{ISO}$ to the gate of isolation PFET 229 ensures that isolation PFET 229 remains in a non-conducting (off) state.

Figure 3:
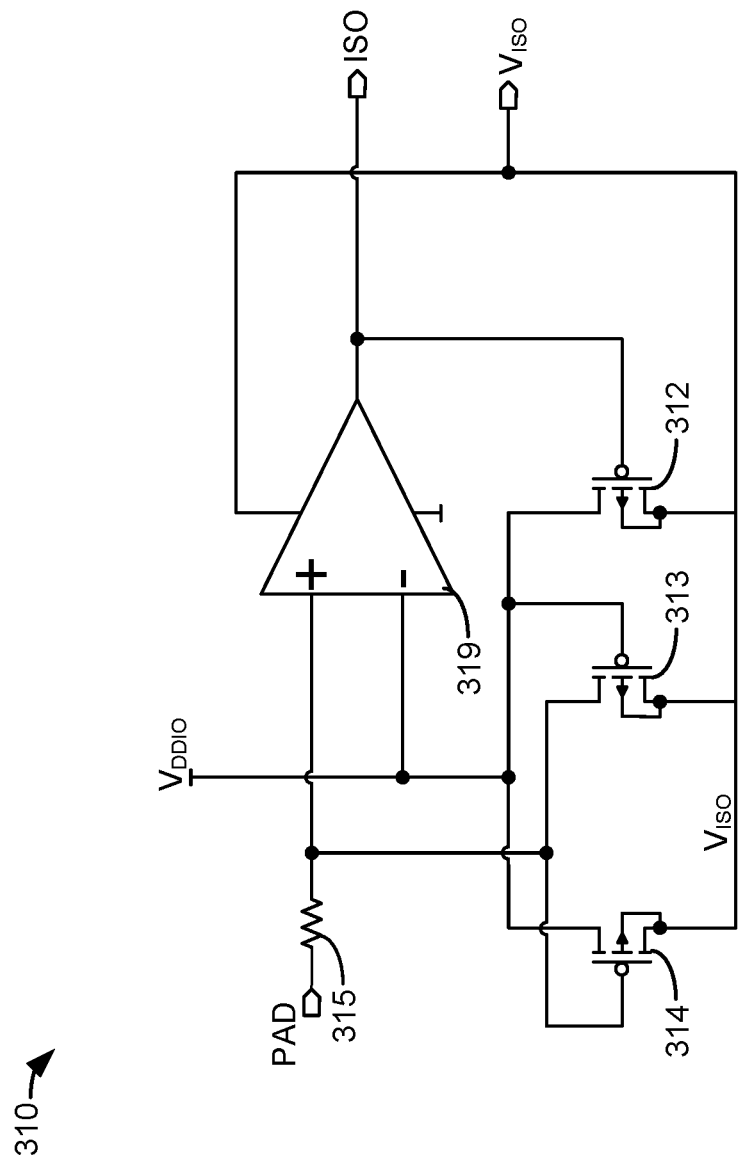
FIG. 3 is a diagram illustrating a first example of isolation voltage switching circuitry.

FIG. 3 is a diagram illustrating a first example of isolation voltage switching circuitry. In FIG. 3, integrated circuit isolation voltage switching circuitry 300 includes PFET 312, PFET 313, PFET 314, optional resistor 315, and comparator 319. Isolation voltage switching circuitry 300 may be, for example, isolation circuitry 110 and/or isolation circuitry 210.

Isolation voltage switching circuitry 300 receives the positive driver supply voltage $V_{DDIO}$ and the voltage on the bonding pad (PAD) direct current (DC) coupled to the driver. Isolation voltage switching circuitry 300 outputs an isolation signal (ISO) and an isolation voltage ($V_{ISO}$). The voltage on the PAD is connected to a first terminal of resistor 315. A second terminal of resistor 315 is connected to the source terminal of PFET 313, gate terminal of PFET 314 and non-inverting input of comparator 319. $V_{DDIO}$ is connected to the inverting input of comparator 319, the source of PFET 312, the source of PFET 314, and the gate of PFET 313. The output of comparator 319 provides the isolation signal ISO and is also provided to the gate of PFET 312. The drain of PFET 312, the drain of PFET 313, and the drain of PFET 314 are connected to the isolation voltage $V_{ISO}$. The body/n-wells of PFETs 312-314 are connected to the isolation voltage $V_{ISO}$. Comparator 319 is powered by the isolation voltage $V_{ISO}$.

When the voltage on $V_{DDIO}$ exceeds the voltage on the bonding pad, the output of comparator 319 is asserted low (e.g., $V_{SSIO}$). This turns PFET 312 on (i.e. conducting) thereby selecting the voltage $V_{DDIO}$ to be provided as $V_{ISO}$. When $V_{DDIO}$ exceeds the voltage on the bonding pad by the threshold voltage of PFET 314, PFET 314 turns on to also select the voltage $V_{DDIO}$ to be provided as $V_{ISO}$. When $V_{DDIO}$ is greater than PAD, PFET 313 is off (i.e., non-conducting) allowing the source of PFET 313 to be pulled to the voltage on PAD via resistor 315. This ensures that PFET 313 is off when $V_{DDIO}$ is greater than PAD thereby blocking the voltage on PAD from being provided as $V_{ISO}$.

When the voltage on $V_{DDIO}$ is less than the voltage on the bonding pad, the output of comparator 319 is asserted high (e.g., $V_{ISO}$). This turns PFET 312 off thereby blocking the voltage $V_{DDIO}$ from being provided as $V_{ISO}$ via PFET 312. When $V_{DDIO}$ is less than PAD by the threshold voltage of PFET 313, PFET 313 is on thereby selecting PAD to be provided as $V_{ISO}$. When $V_{DDIO}$ is less than the voltage on the bonding pad plus the threshold voltage of PFET 314, PFET 314 turns off to block $V_{DDIO}$ from being provided as $V_{ISO}$.

Figure 4:
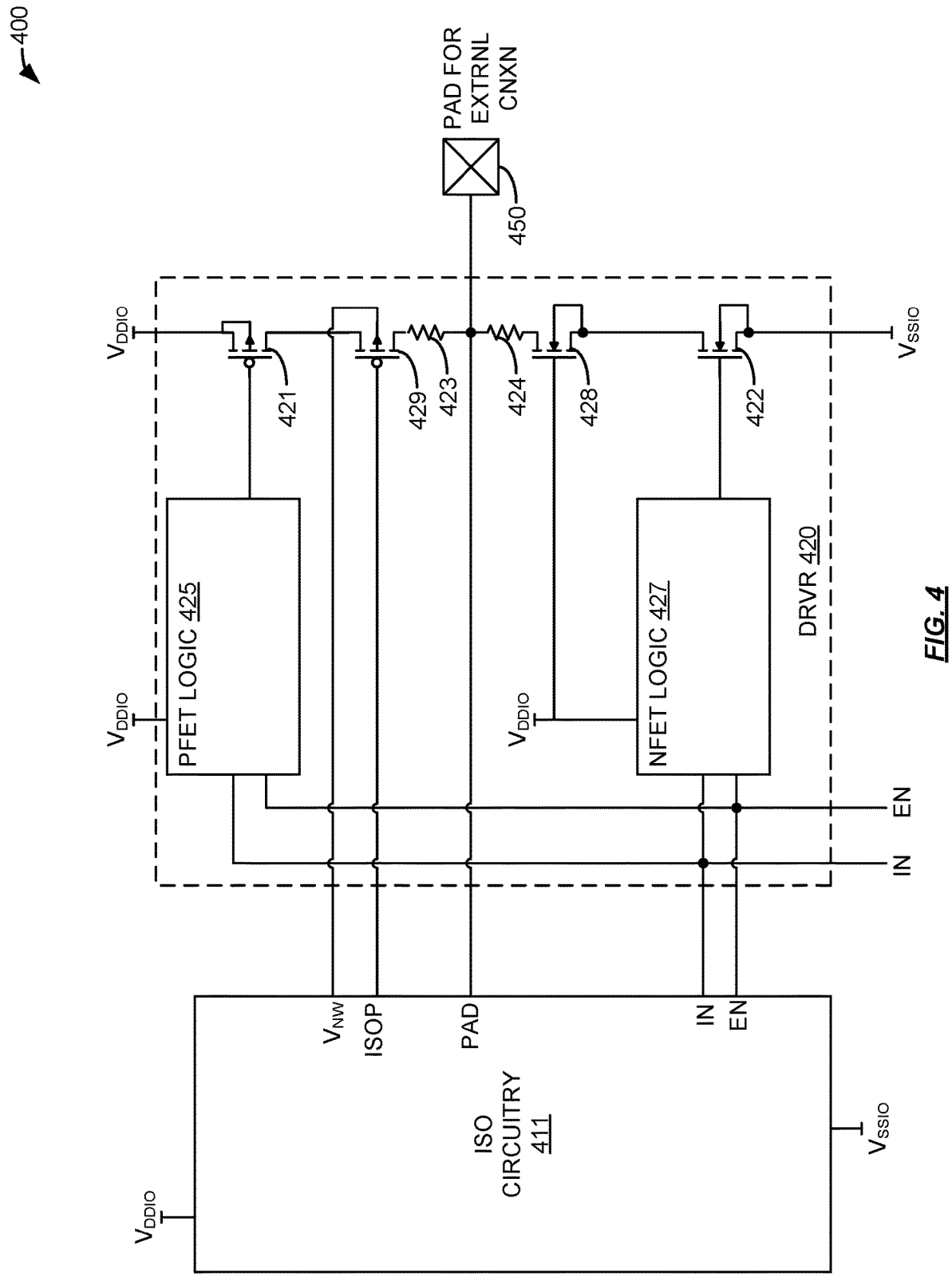
FIG. 4 is a diagram illustrating a third example of a self-isolating driver.

FIG. 4 is a diagram illustrating a third example of a self-isolating driver. In FIG. 4, integrated circuit output driver 400 includes isolation circuitry 411, driver circuitry 420, and bonding pad 450. Driver circuitry 420 includes driver PFET 421, driver NFET 422, resistor 423, resistor 424, PFET logic 425, n-channel field effect transistor (NFET) logic 427, isolation NFET 428, and isolation PFET 429.

Isolation circuitry 411 and driver circuitry 420 receive positive driver supply voltage $V_{DDIO}$. Isolation circuitry 411 provides PFET isolation signal (ISOP) to the gate of isolation PFET 429. Isolation circuitry 411 provides isolation n-well voltage $V_{NW}$ to the body/n-well of isolation PFET 429. Isolation circuitry 411 is connected to bonding pad 450 to receive the voltage on bonding pad 450.

Isolation circuitry 411 and driver circuitry 420 receive positive driver supply voltage $V_{DDIO}$ and negative driver supply voltage $V_{SSIO}$. PFET logic 425 and NFET logic 427 also receive $V_{DDIO}$. Isolation circuitry 411, PFET logic 425 and NFET logic 427 receive an input signal (IN) and an enable signal (EN). The source of driver PFET 421 receives $V_{DDIO}$. The gate of driver PFET 421 is connected to PFET logic 425. The drain of driver PFET 421 is connected to the source of isolation PFET 429. The gate of isolation PFET 429 is connected to PFET isolation signal ISOP. The drain of isolation PFET 429 is connected to a first terminal of resistor 423. A second terminal of resistor 423 is connected to bonding pad 450. A first terminal of resistor 424 is connected to bonding pad 450. A second terminal of resistor 424 is connected to the drain of isolation NFET 428. The gate of isolation NFET 428 is connected to $V_{DDIO}$. The source and body of isolation NFET 428 are connected to the drain of driver NFET 422. The gate of driver NFET 422 is connected to NFET logic 427. The source and body of NFET 422 are connected to the negative driver supply voltage $V_{SSIO}$.

In an embodiment, based on the IN signal, the EN signal, the voltage on $V_{DDIO}$, and the voltage on the bonding pad, isolation circuitry 411 provides either the voltage on the bonding pad (PAD) or a voltage derived from $V_{DDIO}$ as $V_{NW}$. For example, when IN and EN are both asserted, isolation circuitry 411 may provide $V_{DDIO}$ minus a diode drop voltage as $V_{NW}$. When either IN or EN are not asserted, isolation circuitry 411 may provide the voltage on the bonding pad as $V_{NW}$. Similarly, based on the IN signal, the EN signal, the voltage on $V_{DDIO}$, and the voltage on the bonding pad, isolation circuitry 411 provides either the voltage on the bonding pad (PAD) as an asserted ISOP signal to turn isolation PFET 429 off (i.e., to isolate the PAD), or $V_{SSIO}$ as a deasserted ISOP signal to turn isolation PFET 429 on. Note that when $V_{DDIO}$ is powered off, isolation NFET 428 is turned off by the low $V_{DDIO}$ voltage thereby isolating PAD. When $V_{DDIO}$ is powered on, isolation NFET 428 is turned on by the $V_{DDIO}$ voltage thereby allowing PAD to be pulled low by driver NFET 422.

Figure 5:
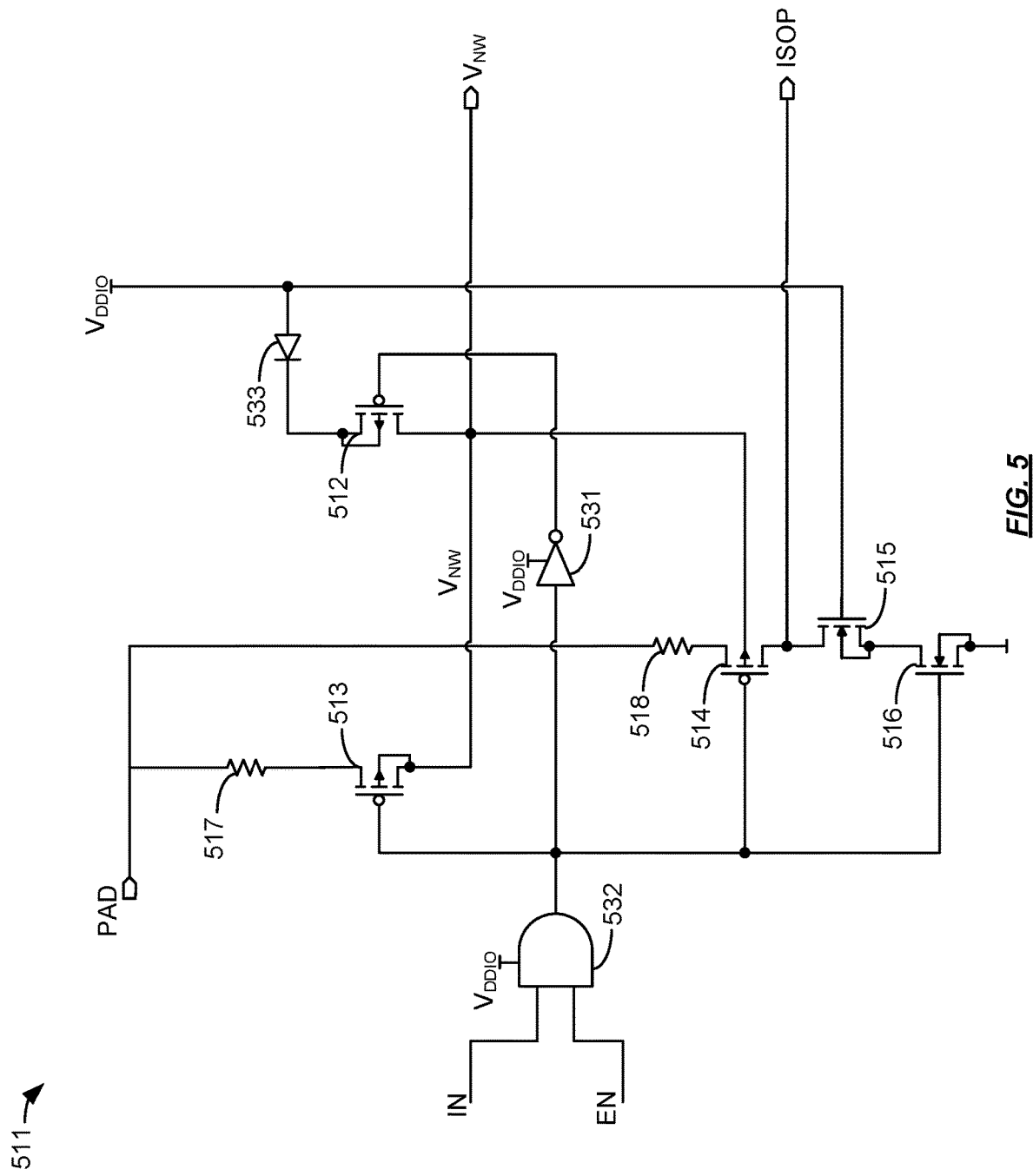
FIG. 5 is a diagram illustrating a second example of isolation voltage switching circuitry.

FIG. 5 is a diagram illustrating a second example of isolation voltage switching circuitry. In FIG. 5, integrated circuit isolation voltage switching circuitry 511 includes PFET 512, PFET 513, PFET 514, NFET 515, NFET 516, resistor 517, resistor 518, inverter 531, AND gate 532, and diode 533. Isolation voltage switching circuitry 511 may be, for example, isolation circuitry 411.

$V_{DDIO}$ is provided to the source of PFET 512 via diode 533. Diode 533 prevents $V_{DDIO}$ from drawing current from PAD via $V_{NW}$ when $V_{DDIO}$ is powered down or the $V_{DDIO}$ voltage is less than the PAD voltage. When IN and EN are both asserted, the output of AND gate 532 turns PFET 513 off. The output of AND gate 532 is received by inverter 531 to turn PFET 512 on when PFET 513 is off (and vice versa). The output of AND gate 532 is also provided to the gate of PFET 514 and the gate of NFET 516. The gate of NFET 515 is connected to VDDIO. When VDDIO is less than PAD, PFET 513 turns on thereby passing $V_{NW}$ to PAD. In this case 512 is also ON. However, diode 533 is reverse biased thereby disallowing current to flow from $V_{NW}$ to $V_{DDIO}$. When either IN or EN are deasserted, AND gate 532 turns PFET 513 on and passing $V_{NW}$ to PAD and PFET LOGIC 425 turns off the PFET 421.

In operation, when either IN or EN are deasserted, AND gate 532 turns PFET 514 on and NFET 516 off. This allows the voltage on PAD to be provided as the ISOP signal via resistor 518 and PFET 514. When IN and EN both asserted, AND gate 532 turns PFET 514 off and NFET 516 on. When VDDIO is also on, NFET 515 is conducting thereby pulling ISOP to $V_{SSIO}$, which can be used by driver circuitry to allow current to flow from VDDIO to the bonding pad.

FIG. 6 is a flowchart illustrating a method of operating an integrated circuit. One or more steps illustrated in FIG. 6 may be performed by, for example, integrated circuit output driver 100, integrated circuit output driver 200, integrated circuit output driver 400, and/or their components. By an integrated circuit, a first voltage level is received from an output driver power supply (602). For example, while in an operational mode, integrated circuit output driver 100 may receive a $V_{DDIO}$ power supply voltage that is within a normal operating range (e.g., 3.0V±10%).

The first voltage level is provided to a source terminal of a p-channel field effect transistor (PFET) where the PFET has a drain terminal DC connected to a first external terminal of the integrated circuit and the external terminal of the integrated circuit has a first variable pad voltage level that does not exceed the first voltage level while the integrated circuit is in an operational mode (604). For example, the $V_{DDIO}$ voltage that is within a normal operating range may be provided to the source terminal of driver PFET 121 where the drain of driver PFET 121 is DC connected to bond pad 150 via resistor 123. While the $V_{DDIO}$ voltage is within the normal operating range, the voltage on bond pad 150 may vary (e.g., due to signaling from other devices connected on a bus) but does not exceed the normal operating range of $V_{DDIO}$.

By the integrated circuit and while the integrated circuit is in a non-operational mode, a second voltage level is received from the output driver power supply where the second voltage level is less than the first voltage level (606). For example, while in a non-operational mode (e.g., powered down), integrated circuit output driver 100 may receive a $V_{DDIO}$ power supply voltage that is lower than the normal operating range (e.g., receive 0.0V or 2.5V when normal operating voltage is 3.0V±10%).

By the integrated circuit and while the integrated circuit is in the non-operational mode, a second variable pad voltage that is greater than the second voltage is received (608). For example, while in a non-operational mode (e.g., powered down), integrated circuit output driver 100 may receive a voltage on bonding pad 150 that is greater than the voltage being received on $V_{DDIO}$. In response to the second variable pad voltage level being greater than the second voltage level, the second variable pad voltage is provided to the body terminal of the PFET (610). For example, isolation circuitry 110 may, in response to the voltage on bonding pad 150 exceeding $V_{DDIO}$, provide the voltage on bonding pad 150 as $V_{ISO}$ to the body terminal of driver PFET 121.

Figure 7:
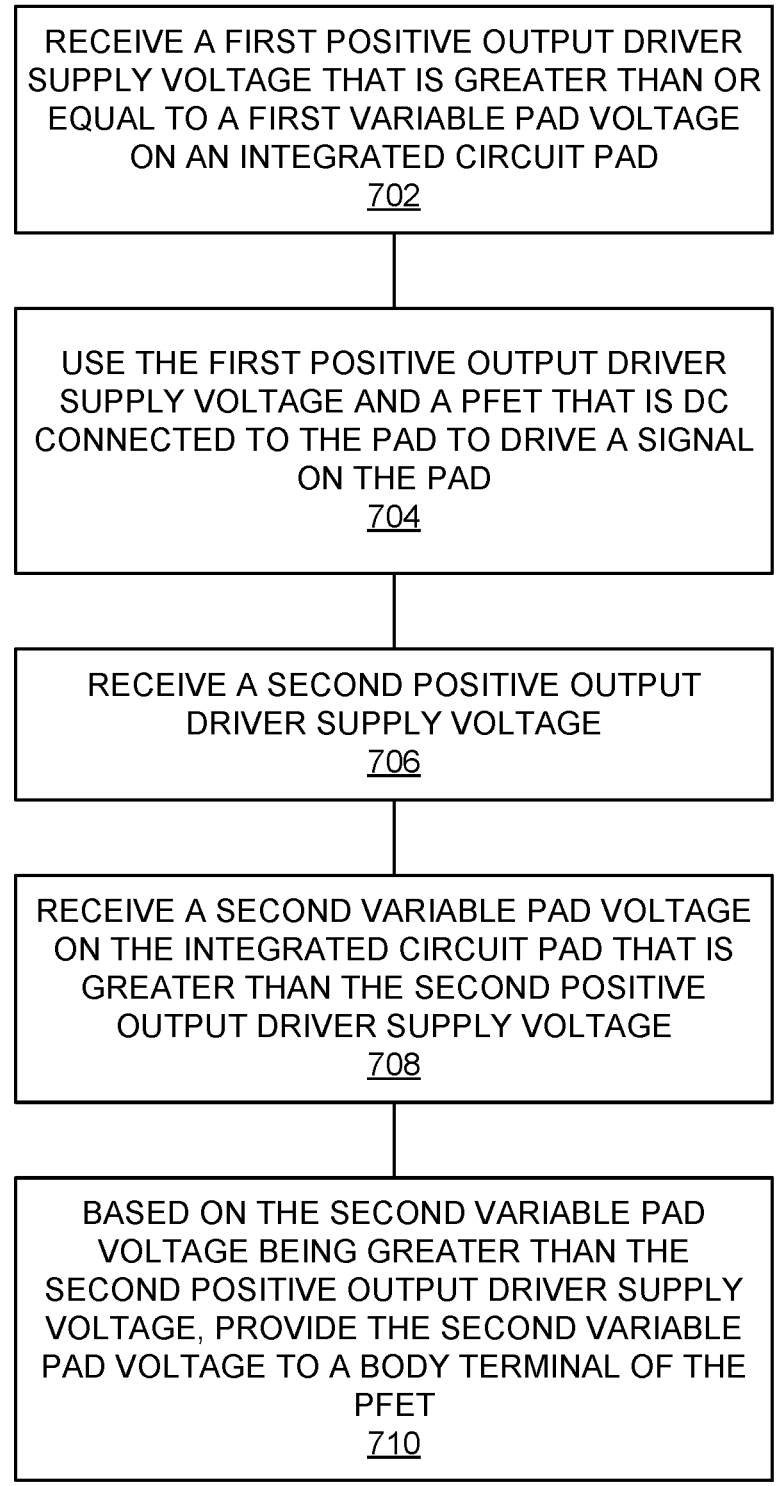
FIG. 7 is a flowchart illustrating a method of switching voltages for isolating a driver field-effect transistor.

FIG. 7 is a flowchart illustrating a method of switching voltages for isolating a driver field-effect transistor. One or more steps illustrated in FIG. 7 may be performed by, for example, integrated circuit output driver 100, integrated circuit output driver 200, integrated circuit output driver 400, and/or their components. A first positive output driver supply voltage that is greater than or equal to a first variable pad voltage on an integrated circuit pad is received (702). For example, a $V_{DDIO}$ voltage that is within a normal operating range (e.g., 3.0V) may be received by integrated circuit output driver 100 while the voltage on bond pad 150 may vary (e.g., due to signaling from other devices connected on a bus) but does not exceed the normal operating range of $V_{DDIO}$.

The first positive output driver supply voltage and a PFET that is DC connected to the pad is used to drive a signal on the pad (704). For example, while in normal operation, integrated circuit output driver 100 may control driver PFET 121 to be in a conducting state causing $V_{DDIO}$ to be conducted through driver PFET 121 to resistor 123 thereby driving a signal onto bonding pad 150 via resistor 123.

A second positive output driver supply voltage is received (706). For example, a $V_{DDIO}$ voltage that is lower than a normal operating range (e.g., 0.0V) may be received by integrated circuit output driver 100. A second variable pad voltage on the integrated circuit pad is received that is greater than the second positive output driver supply voltage (708). For example, integrated circuit output driver 100 may receive a signal voltage driven by another integrated circuit on bonding pad 150 that is greater than the voltage being received on $V_{DDIO}$.

Based on the second variable pad voltage being greater than the second positive output driver supply voltage, the second variable pad voltage is provided to a body terminal of the PFET (710). For example, isolation circuitry 110 may, in response to the voltage on bonding pad 150 exceeding $V_{DDIO}$, provide the voltage on bonding pad 150 as $V_{ISO}$ to the body terminal of driver PFET 121.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of integrated circuit output driver 100, integrated circuit output driver 200, isolation voltage switching circuitry 300, integrated circuit output driver 400, isolation circuitry 500, and/or their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 8:
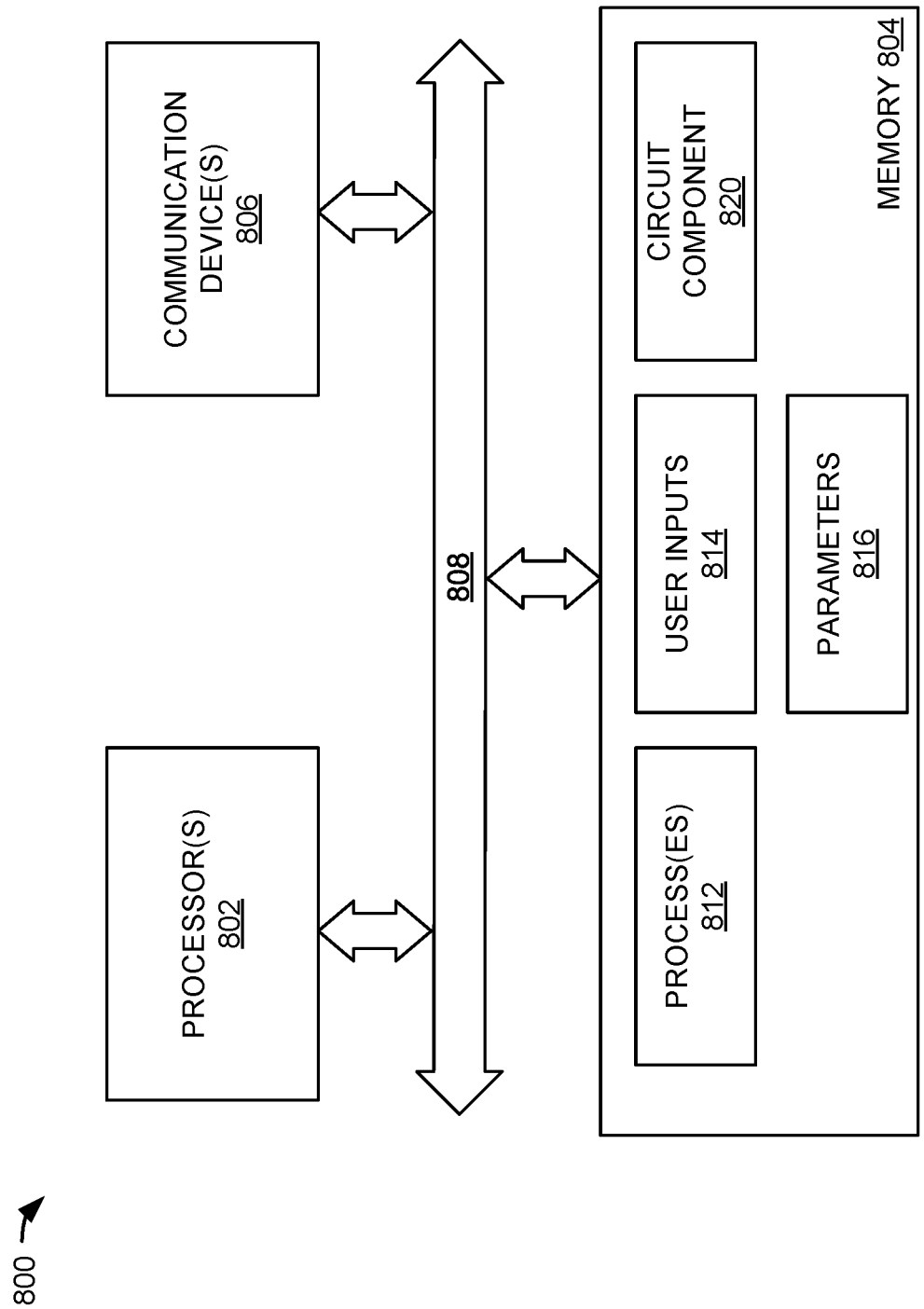
FIG. 8 is a block diagram illustrating a processing system.

FIG. 8 is a block diagram illustrating one embodiment of a processing system 800 for including, processing, or generating, a representation of a circuit component 820. Processing system 800 includes one or more processors 802, a memory 804, and one or more communications devices 806. Processors 802, memory 804, and communications devices 806 communicate using any suitable type, number, and/or configuration of wired and/or wireless connections 808.

Processors 802 execute instructions of one or more processes 812 stored in a memory 804 to process and/or generate circuit component 820 responsive to user inputs 814 and parameters 816. Processes 812 may be any suitable electronic design automation (EDA) tool or portion thereof used to design, simulate, analyze, and/or verify electronic circuitry and/or generate photomasks for electronic circuitry. Representation 820 includes data that describes all or portions of integrated circuit output driver 100, integrated circuit output driver 200, isolation voltage switching circuitry 300, integrated circuit output driver 400, isolation circuitry 500, and/or their components, as shown in the Figures.

Representation 820 may include one or more of behavioral, register transfer, logic component, transistor, and layout geometry-level descriptions. Moreover, representation 820 may be stored on storage media or communicated by carrier waves.

Data formats in which representation 820 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 814 may comprise input parameters from a keyboard, mouse, voice recognition interface, microphone and speakers, graphical display, touch screen, or other type of user interface device. This user interface may be distributed among multiple interface devices. Parameters 816 may include specifications and/or characteristics that are input to help define representation 820. For example, parameters 816 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 804 includes any suitable type, number, and/or configuration of non-transitory computer-readable storage media that stores processes 812, user inputs 814, parameters 816, and circuit component 820.

Communications devices 806 include any suitable type, number, and/or configuration of wired and/or wireless devices that transmit information from processing system 800 to another processing or storage system (not shown) and/or receive information from another processing or storage system (not shown). For example, communications devices 806 may transmit circuit component 820 to another system. Communications devices 806 may receive processes 812, user inputs 814, parameters 816, and/or circuit component 820 and cause processes 812, user inputs 814, parameters 816, and/or circuit component 820 to be stored in memory 804.

Implementations discussed herein include, but are not limited to, the following examples:

Example 1: An integrated circuit, comprising: an output driver configured to transmit signals on a bus via a pad while in an operational mode, the output driver including a first transistor having a direct current (DC) connection to the pad; and, isolation circuitry to, based on a first voltage level on the pad and a second voltage level on a power supply used by the output driver, select a one of the first voltage level and the second voltage level to apply to at least one terminal of the first transistor.

Example 2: The integrated circuit of example 1, wherein the isolation circuitry is configured to select the first voltage level in response to the first voltage level meeting a first criteria.

Example 3: The integrated circuit of example 2, wherein the first criteria is based on the first voltage level exceeding the second voltage level.

Example 4: The integrated circuit of example 3, wherein the first transistor is a p-channel field effect transistor (PFET).

Example 5: The integrated circuit of example 2, wherein the first transistor includes a control terminal and the first voltage level is applied to the control terminal based on the first voltage level meeting the first criteria.

Example 6: The integrated circuit of example 2, wherein the first transistor includes a body terminal and the first voltage level is applied to the body terminal based on the first voltage level meeting the first criteria.

Example 7: The integrated circuit of example 1, wherein the isolation circuitry further comprises: comparator circuitry to provide, to switching circuitry, an indicator of whether the first voltage level exceeds the second voltage level.

Example 8: An integrated circuit, comprising: a transistor, a first terminal of the transistor being DC connected to a first external terminal of the integrated circuit having a first variable voltage level, a second terminal of the transistor being DC connected to a power supply of the integrated circuit having a second variable voltage level; and, switching circuitry configured to provide, based on the first variable voltage level and the second variable voltage level and to a second terminal of the transistor, a one of the first variable voltage level and the second variable voltage level.

Example 9: The integrated circuit of example 8, wherein the switching circuitry is to provide, to the second terminal of the transistor, the first variable voltage level in response to the first variable voltage level exceeding the second variable voltage level.

Example 10: The integrated circuit of example 8, wherein the switching circuitry is to provide, to the second terminal of the transistor, the second variable voltage level in response to the first variable voltage level being less than the second variable voltage level.

Example 11: The integrated circuit of example 8, further comprising: a comparator circuit to provide an indicator of whether the first variable voltage level is greater than the second variable voltage level.

Example 12: The integrated circuit of example 11, wherein the switching circuitry is to provide, to a comparator circuit power supply, the first variable voltage level in response to the first variable voltage level exceeding the second variable voltage level.

Example 13: The integrated circuit of example 8, further comprising:
logic circuitry to provide a variable control voltage to a control terminal of the transistor.

Example 14: The integrated circuit of example 13, wherein the switching circuitry is to provide, to the logic circuitry, the first variable voltage level in response to the first variable voltage level exceeding the second variable voltage level.

Example 15: The integrated circuit of example 13, wherein the logic circuitry is to apply the first variable voltage level to a control terminal of the transistor when the first variable voltage level is exceeding the second variable voltage level.

Example 16: A method of operating an integrated circuit, comprising: receiving, by the integrated circuit, a first voltage level from an output driver power supply; providing the first voltage level to a source terminal of a p-channel field effect transistor (PFET), the PFET having a drain terminal DC connected to a first external terminal of the integrated circuit, the first external terminal of the integrated circuit having a first variable pad voltage level that does not exceed the first voltage level while the integrated circuit is in an operational mode; receiving, by the integrated circuit and while the integrated circuit is in a non-operational mode, a second voltage level from the output driver power supply, the second voltage level being less than the first voltage level; receiving, by the integrated circuit and while the integrated circuit is in the non-operational mode, a second variable pad voltage level that is greater than the second voltage level; and, in response to the second variable pad voltage level being greater than the second voltage level, providing the second variable pad voltage level to a body terminal of the PFET.

Example 17: The method of example 16, further comprising: in response to the second variable pad voltage level being greater than the second voltage level, providing the second variable pad voltage level to a gate terminal of the PFET.

Example 18: The method of example 16, further comprising: in response to the second variable pad voltage level being greater than the second voltage level, controlling an NFET to be non-conducting.

Example 19: The method of example 16, further comprising: in response to the second variable pad voltage level being greater than the second voltage level, providing the second variable pad voltage level to logic circuitry coupled to a control terminal of the PFET; and, providing, by the logic circuitry, the second variable pad voltage level to a control terminal of the PFET.

Example 20: The method of example 16, further comprising: comparing the second variable pad voltage level to the second voltage level to determine whether the second variable pad voltage level is greater than the second voltage level.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An integrated circuit, comprising:
   an output driver configured to transmit signals on a bus via a pad while the integrated circuit is in an operational mode, the output driver including a first transistor having a direct current (DC) connection to the pad; and
   isolation circuitry to, while the integrated circuit is in a non-operational mode and based on a first voltage level on the pad and a second voltage level on a power supply used by the output driver, select a one of the first voltage level and the second voltage level to apply to at least one terminal of the first transistor.

2. The integrated circuit of claim 1, wherein the isolation circuitry is configured to select the first voltage level in response to the first voltage level meeting a first criteria.

3. The integrated circuit of claim 2, wherein the first criteria is based on the first voltage level exceeding the second voltage level.

4. The integrated circuit of claim 3, wherein the first transistor is a p-channel field effect transistor (PFET).

5. The integrated circuit of claim 2, wherein the first transistor includes a control terminal and the first voltage level is applied to the control terminal based on the first voltage level meeting the first criteria.

6. The integrated circuit of claim 2, wherein the first transistor includes a body terminal and the first voltage level is applied to the body terminal based on the first voltage level meeting the first criteria.

7. The integrated circuit of claim 1, wherein the isolation circuitry further comprises:
   comparator circuitry to provide, to switching circuitry, an indicator of whether the first voltage level exceeds the second voltage level.

8. An integrated circuit, comprising:
   a transistor, a first terminal of the transistor being DC connected to a first external terminal of the integrated circuit and having a first variable voltage level, a second terminal of the transistor being DC connected to a power supply of the integrated circuit and having a second variable voltage level; and
   switching circuitry configured to provide, while the integrated circuit is in a non-operational mode and based on the first variable voltage level and the second variable voltage level, and to a third terminal of the transistor, a one of the first variable voltage level and the second variable voltage level.

9. The integrated circuit of claim 8, wherein the switching circuitry is to provide, to the third terminal of the transistor, the first variable voltage level in response to the first variable voltage level exceeding the second variable voltage level.

10. The integrated circuit of claim 8, wherein the switching circuitry is to provide, to the third terminal of the transistor, the second variable voltage level in response to the first variable voltage level being less than the second variable voltage level.

11. The integrated circuit of claim 8, further comprising:
a comparator circuit to provide an indicator of whether the first variable voltage level is greater than the second variable voltage level.

12. The integrated circuit of claim 11, wherein the switching circuitry is to provide, to a comparator circuit power supply, the first variable voltage level in response to the first variable voltage level exceeding the second variable voltage level.

13. The integrated circuit of claim 8, further comprising:
logic circuitry to provide a variable control voltage to a control terminal of the transistor.

14. The integrated circuit of claim 13, wherein the switching circuitry is to provide, to the logic circuitry, the first variable voltage level in response to the first variable voltage level exceeding the second variable voltage level.

15. The integrated circuit of claim 13, wherein the logic circuitry is to apply the first variable voltage level to the control terminal of the transistor when the first variable voltage level is exceeding the second variable voltage level.

16. A method of operating an integrated circuit, comprising:
receiving, by the integrated circuit, a first voltage level from an output driver power supply;
providing the first voltage level to a source terminal of a p-channel field effect transistor (PFET), the PFET having a drain terminal DC connected to a first external terminal of the integrated circuit, the first external terminal of the integrated circuit having a first variable pad voltage level that does not exceed the first voltage level while the integrated circuit is in an operational mode;
receiving, by the integrated circuit and while the integrated circuit is in a non-operational mode, a second voltage level from the output driver power supply, the second voltage level being less than the first voltage level;
receiving, by the integrated circuit and while the integrated circuit is in the non-operational mode, a second variable pad voltage level that is greater than the second voltage level; and
in response to the second variable pad voltage level being greater than the second voltage level, providing the second variable pad voltage level to a body terminal of the PFET.

17. The method of claim 16, further comprising:
in response to the second variable pad voltage level being greater than the second voltage level, providing the second variable pad voltage level to a gate terminal of the PFET.

18. The method of claim 16, further comprising:
in response to the second variable pad voltage level being greater than the second voltage level, controlling an NFET to be non-conducting.

19. The method of claim 16, further comprising:
in response to the second variable pad voltage level being greater than the second voltage level, providing the second variable pad voltage level to logic circuitry coupled to a control terminal of the PFET; and
providing, by the logic circuitry, the second variable pad voltage level to a control terminal of the PFET.

20. The method of claim 16, further comprising:
comparing the second variable pad voltage level to the second voltage level to determine whether the second variable pad voltage level is greater than the second voltage level.

\* \* \* \* \*